United States Patent
Arakawa

(12) 
(10) Patent No.: US 6,627,895 B2
(45) Date of Patent: *Sep. 30, 2003

(54) RADIATION IMAGE DETECTING SYSTEM

(75) Inventor: Satoshi Arakawa, Kanagawa-ken (JP)

(73) Assignee: Fuji Photo Film Co., Ltd., Kanagawa-Ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/385,443

(22) Filed: Aug. 30, 1999

(65) Prior Publication Data

US 2002/0134944 A1 Sep. 26, 2002

(30) Foreign Application Priority Data

Aug. 28, 1998 (JP) ............................. 10-243379

(51) Int. Cl.⁷ ............................................. H01L 31/08
(52) U.S. Cl. ............................. 250/370.09; 250/370.11; 250/580
(58) Field of Search ....................... 250/370.11, 370.09, 250/591, 580

(56) References Cited

U.S. PATENT DOCUMENTS

| | | | | |
|---|---|---|---|---|
| 4,803,359 A | | 2/1989 | Hosoi et al. ............. 250/327.2 |
| 5,063,450 A | * | 11/1991 | Pritchard ................. 348/219.1 |
| 5,187,369 A | | 2/1993 | Kingsley et al. ....... 250/370.11 |
| 5,299,275 A | * | 3/1994 | Jackson et al. ............. 385/116 |
| 5,489,782 A | * | 2/1996 | Wernikoff ................... 250/369 |
| 5,554,850 A | * | 9/1996 | Hejazi ........................ 250/367 |
| 5,563,421 A | * | 10/1996 | Lee et al. .................... 250/580 |
| 5,594,253 A | * | 1/1997 | Bueno et al. ............. 250/486.1 |
| 5,682,266 A | * | 10/1997 | Meyers ........................ 359/571 |
| 5,684,293 A | * | 11/1997 | Kessler ..................... 250/208.1 |
| 6,326,998 B1 | * | 12/2001 | Palum ......................... 348/342 |
| 2001/0017741 A1 | * | 8/2001 | Tamaru et al. ............... 359/885 |

FOREIGN PATENT DOCUMENTS

| | | | |
|---|---|---|---|
| EP | 898421 A2 | 2/1999 | ............ H04N/5/30 |
| JP | 1-216290 | 8/1989 | ............. G01T/1/24 |
| JP | 2-164067 | 6/1990 | ......... H01L/27/146 |

* cited by examiner

Primary Examiner—Constantine Hannaher
(74) Attorney, Agent, or Firm—Sughrue Mion, PLLC

(57) ABSTRACT

A radiation image detecting system includes a solid radiation detector. The solid radiation detector is formed by a conversion layer which converts radiations bearing thereon image information to electric charges, and a two-dimensional image reader which detects the electric charges obtained by the conversion and is formed by a two-dimensional array of a plurality of solid radiation detecting elements. A high frequency component attenuation phosphor layer attenuates high frequency components of the electric charges bearing thereon high frequency components of the image information not lower than a Nyquist frequency, which is defined by the pitches of the array of the solid radiation detecting elements, so that aliasing noise due to the high frequency components of the image information not lower than the Nyquist frequency becomes not stronger than 30% of intrinsic noise power at a frequency equal to a half of the Nyquist frequency.

4 Claims, 1 Drawing Sheet

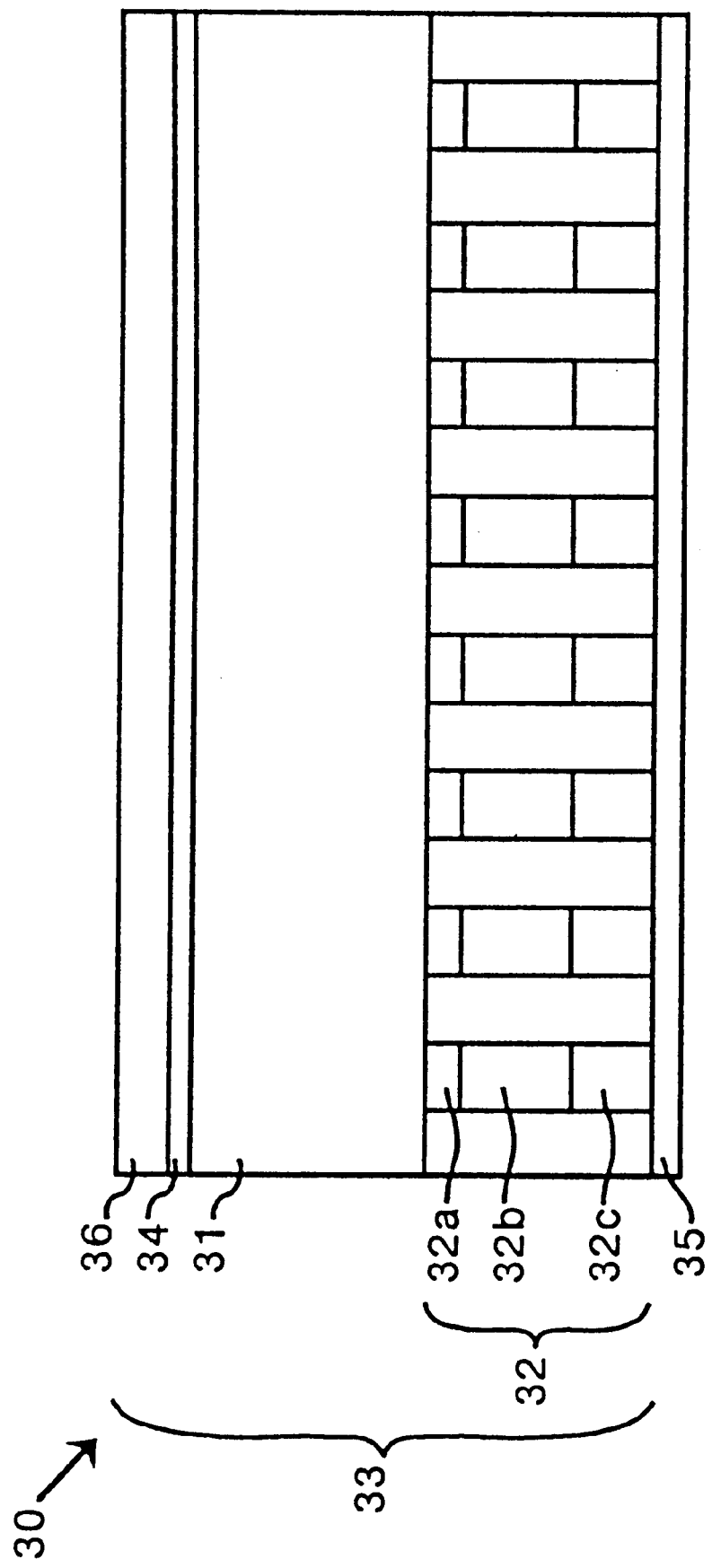

RADIATION IMAGE DETECTING SYSTEM

BACKGROUND OF THE INVENTION

1. Field of the Invention

This invention relates to a radiation image detecting system, and more particularly to a radiation image detecting system which is provided with a two-dimensional image detecting means comprising a plurality of solid radiation detecting elements which are two-dimensionally arranged in an array.

2. Description of the Related Art

There has been known a radiation image information read-out system using radiographic film or a stimulable phosphor sheet in medical radiography.

Recently there has been proposed a radiation image detecting system employing a solid radiation detector including a semiconductor as a major part which detects radiations and converts the intensity of radiations to an electric signal. Though various types of solid radiation detectors have been proposed, the following solid radiation detectors are representative.

That is, a solid radiation detector comprising a two-dimensional image detecting means formed by two-dimensionally forming a plurality of photoelectric conversion elements (each forming a picture element) on an insulating substrate, and a phosphor layer (scintillator) which is formed on the two-dimensional image detecting means and generates visible light bearing thereon image information when exposed to radiations bearing thereon image information. The solid radiation detector of this type will be referred to as "a photo-conversion type solid radiation detector", hereinbelow.

A solid radiation detector comprising a two-dimensional image detecting means formed by two-dimensionally forming a plurality of charge collection electrodes (each forming a picture element) on an insulating substrate, and a radiation-conductive material layer which is formed on the two-dimensional image detecting means and generates electric charges bearing thereon image information when exposed to radiations bearing thereon image information. The solid radiation detector of this type will be referred to as "a direct conversion type solid radiation detector", hereinbelow.

The photo-conversion type solid radiation detectors are disclosed, for instance, in Japanese Unexamined Patent Publication Nos. 59(1984)-211263 and 2(1990)-164067, PCT International Publication no. WO92/06501, "Signal, noise, and read out considerations in the development of amorphous silicon photodiode arrays for radiography and diagnostic x-ray imaging", L. E. Antonuk et et. al., University of Michigan, R. A. Street Xerox, PARC, SPIE vol. 1443,"Medical Imaging V", Image Physics(1991), pp. 108–119, and the like.

In the photo-conversion type solid radiation detector, the photoelectric conversion elements have also function of storing detected electric charges, and the electric charges obtained by photoelectric conversion are stored in the photoelectric conversion elements as latent image charges.

As the direct conversion type solid radiation detector, the following have been proposed.

1) A solid radiation detector which is about ten times as large as normal solid radiation detectors in thickness as measured in the direction in which radiations are transmitted through the solid radiation detector. See "MATERIAL PARAMETERS IN THICK HYDROGENATED AMORPHOUS SILICON RADIATION DETECTORS", Lawrence Berkeley Laboratory. University of California, Berkeley, Calif. 94720 Xerox Parc. Palo Alto. Calif. 94304.

2) Those comprising a plurality of solid radiation detectors laminated in the direction in which radiations are transmitted with metal plates intervening therebetween. See "Metal/Amorphous Silicon Multilayer Radiation Detectors", IEE TRANSACTIONS ON NUCLEAR SCIENCE. VOL. 36. NO. 2 APRIL 1989.

3) Solid radiation detectors using CdTe and the like disclosed in Japanese Unexamined Patent Publication No. 1(1989)-216290.

In the direct conversion type solid radiation detector, a capacitor is connected to each of the charge collection electrodes and the electric charges collected by the charge collection electrodes are stored in the capacitors as latent image charges.

This applicant has proposed an improvement on the direct conversion type solid radiation detector as disclosed in Japanese Patent Application 9(1997)-222114 and 10(1998)-215378. The solid radiation detector will be referred to as "an improved direct conversion type solid radiation detector", hereinbelow.

The improved direct conversion type solid radiation detector comprises a first conductive layer which is transparent to recording radiations, a recording photoconductive layer which exhibits photoconductivity upon exposure to the recording radiations passing through the first conductive layer, a charge transfer layer which acts substantially as an insulator to electric charges of the same polarity as that in which the first conductive layer is charged and as a conductor to electric charges reverse to that in which the first conductive layer is charged, a read-out photoconductive layer which exhibits photoconductivity upon exposure to read-out electromagnetic waves, and a second conductive layer which is transparent to the read-out electromagnetic waves. These layers are superposed one on another in this order and latent image charges are collected on the interface between the recording photoconductive layer and the charge transfer layer.

As a system for reading out the latent image charges in the improved direct conversion type solid radiation detector, there may be employed a read-out system where the read-out electrode (the second conductive layer) is like a flat plate and the latent image charges are read out by scanning the read-out electrode with a read-out light spot such as a laser beam, or a read-out system where the read-out electrode is a stripe electrode made up of a plurality line electrodes which extend in one direction and are arranged in another direction and the latent image charges are read out by scanning the stripe electrode with a line read-out beam, extending in a direction perpendicular to the longitudinal direction of the line electrodes, in the longitudinal direction of the line electrodes. Further there has been known a read-out system where a recording stripe electrode made up of a plurality line electrodes is provided so that the line electrodes extend substantially in a direction perpendicular to the longitudinal direction of the line electrodes of the read-out electrode.

In any one of the solid radiation detectors described above, a detecting circuit which detects the latent image charges stored by the solid radiation detecting elements is connected to the solid radiation detector. The detecting circuit converts the latent image charges stored by the solid radiation detecting elements to an image signal, and the image signal is output after subjected to a predetermined image processing, and is reproduced as a visible image by a reproducing system such as a CRT.

The "solid radiation detecting element" is a general term for elements respectively formed by the photoelectric conversion element of the photo-conversion type solid radiation detector and a switching element; by the charge collection electrode of the direct conversion type solid radiation detector, a capacitor and a switching element; and by the charge transfer layer, the read-out photoconductive layer and the second conductive layer of the improved direct conversion type solid radiation detector. In the case of the improved direct conversion type solid radiation detector, the charge transfer layer, the read-out photoconductive layer and the second conductive layer are solid and do not form a plurality of discrete detecting elements. However the parts exposed to the read-out light spot, the parts corresponding to intersections of the line read-out beam and the read-out electrode, that is the line electrodes of the stripe electrode, or the parts corresponding to the intersections of the line electrodes of the recording electrode and the read-out electrode behave as if they were discrete detecting elements. Accordingly, in this specification, it should be interpreted that the parts listed above are also the solid radiation detecting elements and the improved direct conversion type solid radiation detector is also a two-dimensional image detecting means in which a plurality of solid radiation detecting elements are two-dimensionally arranged in a two-dimensional array.

In the photo-conversion type solid radiation detector, radiations impinging upon the phosphor layer is once converted to visible light and charges obtained by detecting the visible light by, for instance, photodiodes are stored as latent image charges. Accordingly, in the solid radiation detector of this type, high frequency components (high sharpness components) of the image information naturally attenuates due to dispersion of light in the course of converting the radiations to visible light, which results in a blurred image.

In the direct conversion type or improved direct conversion type solid radiation detector, when light impinges upon the radiation-conductive material layer or the recording photoconductive layer, electrons (negative charges) and holes (positive charges) are generated. When recording radiation image information on the solid radiation detectors of these types, radiations bearing thereon image information are projected onto the radiation-conductive layer or the recording photoconductive layer while imparting a predetermined direct current field, and charges thereby generated in the radiation-conductive layer or the recording photoconductive layer are collected to the charge collection electrodes or the interface between the recording photoconductive layer and the charge transfer layer by the direct current field, thereby forming latent image charges. Accordingly, in the solid radiation detectors of the direct conversion type or the improved direct conversion type, dispersion of charges cannot occur in the course of generation of charges or collection of the charges and image information can be faithfully reproduced up to a Nyquist frequency, which is determined by the pitches of the array of the solid radiation detecting elements, by separately detecting latent image charges by the respective solid radiation detecting elements, whereby an image can be reproduced with very small blur and with sharpness components reproduced faithfully.

Generally radiation image information includes high frequency components higher than the Nyquist frequency. When radiations bearing thereon radiation image information including high frequency components higher than the Nyquist frequency are projected onto the direct conversion type or the improved direct conversion type solid radiation detector, image signal components bearing thereon the high frequency components higher than the Nyquist frequency turn back toward the low frequency side and are detected as so-called aliasing noise, which increases noise in the image signal.

Since the aliasing noise appears on the low frequency side lower than the Nyquist frequency, it is very difficult to distinguish the aliasing noise from the regular image signal components and to remove the same from the image signal. When an image is reproduced on the basis of an image signal including aliasing noise, an image very bad in quality is output.

To the contrast, in the case of the photo-conversion type solid radiation detector, high frequency components attenuate due to dispersion of light in the course of converting the radiation bearing thereon image information to visible light as described above, and the image signal components bearing thereon the high frequency components higher than the Nyquist frequency also attenuate. Accordingly, in the case of the photo-conversion type solid radiation detector, the problem of deterioration of the image quality due to aliasing noise is less as compared with the direct conversion type or improved direct conversion type solid radiation detector.

SUMMARY OF THE INVENTION

In view of the foregoing observations and description, the primary object of the present invention is to provide a radiation image detecting system which can output a high quality image less in aliasing noise even if a direct conversion type or improved direct conversion type solid radiation detector is employed.

In accordance with the present invention, there is provided a radiation image detecting system comprising a solid radiation detector comprising a conversion means which converts radiations bearing thereon image information to electric charges, and a two-dimensional image detecting means which detects the electric charges obtained by the conversion and is formed by a two-dimensional array of a plurality of solid radiation detecting elements, each corresponding to a picture element, wherein the improvement comprises a high frequency component attenuation means which attenuates high frequency components of the electric charges bearing thereon high frequency components of the image information not lower than a Nyquist frequency, which is defined by the pitches of the array of the solid radiation detecting elements, so that aliasing noise due to the high frequency components of the image information not lower than the Nyquist frequency becomes not stronger than 30% of intrinsic noise power at a frequency equal to a half of the Nyquist frequency.

The "conversion means which converts radiations bearing thereon image information to electric charges" is the recording photoconductive layer when an improved direct conversion type solid radiation detector is used, and is the radiation-conductive layer when a direct conversion type solid radiation detector is used.

The "pitches of the array of the solid radiation detecting elements" are pitches at which the "solid radiation detecting elements" as defined above are arranged in an array.

The "intrinsic noise power" means the power which the aliasing noise would have but for the high frequency component attenuation means.

The high frequency component attenuation means is a means for attenuating the high frequency components of the electric charges bearing thereon high frequency components of the image information not lower than a Nyquist frequency and may be of any form so long as it can attenuate the high frequency components so that the aliasing noise due to the high frequency components of the image information not lower than the Nyquist frequency becomes not stronger than 30% of intrinsic noise power at a frequency equal to a half of the Nyquist frequency. For example, the high frequency component attenuation means may attenuate the high frequency components physically, chemically, optically, electrically or magnetically. In the case where the high frequency component attenuation means attenuates the high frequency components physically or chemically, the attenuation may be realized by adjusting the material or the thickness of the recording photoconductive layer and/or the radiation-conductive layer. In the case where the high frequency component attenuation means attenuates the high frequency components optically, the attenuation may be realized by once converting the radiations to visible light. In the case where the high frequency component attenuation means attenuates the high frequency components electrically, the attenuation may be realized by controlling the electric field applied to the recording photoconductive layer and the radiation-conductive layer, and in the case where the high frequency component attenuation means attenuates the high frequency components magnetically, the attenuation may be realized by applying a magnetic field to the recording photoconductive layer and the radiation-conductive layer.

However it is preferred that the high frequency component attenuation means comprises a phosphor layer which generates visible light upon exposure to radiations bearing thereon the image information and is provided on the conversion means side of the solid radiation detector and the conversion means generates electric charges upon exposure to the visible light generated by the phosphor layer. The degree of the attenuation may be controlled by controlling the material and/or the thickness of the phosphor layer taking into account the pitches of the array of the solid radiation detecting elements, and the thickness and/or the material of the conversion means.

It is further preferred that the phosphor layer be removable, or the thickness and/or the material of the phosphor layer be variable.

In the radiation image detecting system of the present invention, since the high frequecy component attenuation means attenuates the high frequency components of the electric charges bearing thereon high frequency components of the image information not lower than the Nyquist frequency so that aliasing noise due to the high frequency components of the image information not lower than the Nyquist frequency becomes not stronger than 30% of intrinsic noise power at a frequency equal to a half of the Nyquist frequency, the aliasing noise included in the image signal is reduced and a high quality image less in the aliasing noise can be obtained.

When the high frequecy component attenuation means comprises a phosphor layer which generates visible light upon exposure to radiations bearing thereon the image information and is provided on the conversion means side of the solid radiation detector and the conversion means generates electric charges upon exposure to the visible light generated by the phosphor layer, the high frequency components in the image information can be attenuated due to dispersion of light in the course of converting the radiations to visible light and the present invention can be realized with a simple structure.

Further when the phosphor layer is removable, the phosphor layer can be removed, for instance, when it is desired that the high frequency components be faithfully reproduced.

Further when the thickness and/or the material of the phosphor layer is variable, requirement on the quality of the output image can be satisfied while keeping a balance of aliasing noise and reproducibility of the high frequency components.

BRIEF DESCRIPTION OF A DRAWING

The sole FIGURE is a schematic cross-sectional view of the radiation image detecting system in accordance with an embodiment of the invention where a direct conversion type solid radiation detector is employed.

DESCRIPTION OF THE PREFERRED EMBODIMENTS

A radiation image detecting system 30 in accordance with an embodiment of the present invention where a direct conversion type solid radiation detector is employed will be described with reference to the sole FIGURE, hereinbelow.

The radiation image detecting system 30 of this embodiment comprises a direct conversion type solid radiation detector 33 comprising a two-dimensional image reader 32 formed on an insulating substrate (not shown) and a radiation-conductive material layer 31 which is formed on the two-dimensional image reader 32 and generates electric charges bearing thereon image information when exposed to radiations bearing thereon image information. A phosphor layer 36 which generates visible light upon exposure to radiations bearing thereon image information is formed on the radiation-conductive material layer 31 with a first electrode 34 intervening therebetween.

The two-dimensional image reader 32 comprises a plurality of charge collection electrodes 32a which are arranged in a matrix-like fashion on the insulating substrate (e.g., a 3 mm thick silica glass plate) at predetermined pitches and each of which forms a picture element, a plurality of capacitors 32b which store signal charges collected by the respective charge collection electrodes 32a as latent image charges, and a plurality of switching elements 32c such as TFTs which transfer the latent image charges stored in the capacitors 32b to a detecting circuit which is not shown. A second electrode 35 is provided between the switching elements 32c and the insulating substrate.

The phosphor layer 36 forms a high frequecy component attenuation means. The phosphor layer 36 may comprise, for instance, phosphor including $Gd_2O_2S:Tb$ as a major component and may be about 100 μm in thickness. The phosphor layer 36 may be provided in close contact with the first electrode 34 or near the same. The phosphor layer 36 may comprise phosphor including as a major component CsI:Tl or BFX:Eu (wherein X represents Cl, Br, I or a mixture of these elements) in place of $Gd_2O_2S:Tb$.

The first electrode 34 is transparent so that visible light generated by the phosphor layer 36 impinges upon the radiation-conductive material layer 31.

The radiation-conductive material layer 31 forms the aforesaid conversion means which converts radiations bearing thereon image information to electric charges and also generates electric charges upon exposure to visible light generated by the phosphor layer 36. Specifically the radiation-conductive material layer 31 may comprise a layer which includes amorphous selenium (a-Se) as a major component and is deposited on the two-dimensional image reader 32 in a thickness of about 400 μm. The radiation-conductive material layer 31 may comprise $PbI_2$ or $HgI_2$ in place of a-Se.

Operation of the radiation image detecting system 30 of this embodiment will be described, hereinbelow.

When radiations bearing thereon image information are projected onto the phosphor layer 36, one part of the radiations is converted to visible light by the phosphor layer 36 and the other part of the radiations together with the visible light passes through the first electrode 34 and impinges upon the radiation-conductive material layer 31. When said one part of the radiations is converted to visible light, high frequency components of the image information born by said one part of the radiations are attenuated by dispersion of light.

The radiation-conductive layer 31 generates therein electric charges corresponding to the image information born by the visible light and said the other part of the radiations. At this time, since high frequency components of the image information born by said one part of the radiations have been attenuated, the high frequency components of the image information born by the electric charges thus generated are attenuated.

The material and/or thickness of the phosphor layer 36 is selected so that aliasing noise due to the high frequency components of the image information not lower than a Nyquist frequency, which is defined by the pitches of the array of the charge collection electrodes 32a, becomes not stronger than 30% of intrinsic noise power at a frequency equal to the half of the Nyquist frequency, the intrinsic noise power being the power which the aliasing noise would have but for the phosphor layer 36. Accordingly, in this embodiment, the aliasing noise included in the image signal is reduced and a high quality image less in the aliasing noise can be obtained. In this particular embodiment, the radiation-conductive material layer 31 is formed of phosphor including as a major component amorphous selenium (a-Se) and is about 400 $\mu$m in thickness, the phosphor layer comprises phosphor including $Gd_2O_2S$:Tb as a major component and is about 100 $\mu$m in thickness, and the pitches of the array of the charge collection electrodes 32a are 200 $\mu$m. In this case, the aliasing noise due to the high frequency components of the image information not lower than the Nyquist frequency can be attenuated not stronger than 20% of the intrinsic noise power at a frequency of 1.25 cycle/mm which is equal to the half of the Nyquist frequency.

When the phosphor layer 36 comprises phosphor including $Gd_2O_2S$:Tb as a major component, high energy components of the radiations, which cannot be sufficiently absorbed solely by the radiation-conductive material layer 31 formed of phosphor including as a major component amorphous selenium (a-Se), can be converted to visible light and image information born by such high energy components of the radiations can be reproduced.

When the phosphor layer 36 is employed., high frequency components lower than the Nyquist frequency can be slightly attenuated. Accordingly, in the case where it is preferred that high frequency information be faithfully reproduced though aliasing noise is included in the output image, it is preferred that the phosphor layer 36 be removed. For this purpose, it is preferred that the phosphor layer 36 (a high frequency component attenuation means) be removable.

Further, when the thickness and/or the material of the phosphor layer 36 is variable, requirement on the quality of the output image can be satisfied while keeping a balance of aliasing noise and reproducibility of the high frequency components. The thickness and/or the material of the phosphor layer 36 may be changed by switching phosphor layers 36 which are different from each other in thickness and/or material or by changing the numbers of the phosphor layers 36 provided on the radiation-conductive material layer 31. In this case, the phosphor layers 36 may be the same in thickness and/or material.

Though, in the embodiment described above, the phosphor layer 36 is employed as the high frequency component attenuation means, the high frequency component attenuation means need not be limited to the phosphor layer but may be of any form so long as it can attenuate the high frequency components so that the aliasing noise due to the high frequency components of the image information not lower than the Nyquist frequency becomes not stronger than 30% of the intrinsic noise power at a frequency equal to a half of the Nyquist frequency. For example, the high frequency component means may attenuate the high frequency components physically, chemically, optically, electrically, or magnetically. In the case where the high frequency component attenuation means attenuates the high frequency components physically or chemically, the attenuation may be realized by adjusting the material or the thickness of the recording photoconductive layer and/or the radiation-conductive layer. In the case where the frequency component attenuation means attenuates the high frequency components optically, the attenuation may be realized by once converting the radiations to visible light. In the case where the high frequency component attenuation means attenuates the high frequency components electrically, the attenuation may be realized by controlling the electric field applied to the recording photoconductive layer and the radiation-conductive layer, and in the case where the high frequency component attenuation means attenuates the high frequency components magnetically, the attenuation may be realized by applying a magnetic field to the recording photoconductive layer and the radiation-conductive layer.

Though, in the embodiment described above, a direct conversion type solid radiation detector is employed, an improved direct conversion type solid radiation detector may be employed in place of the direct conversion type solid radiation detector.

What is claimed is:

1. A radiation image detecting system, comprising a solid radiation detector comprising a conversion means which converts radiations bearing thereon image information to electric charges, and a two-dimensional image detecting means which detects the electric charges obtained by the conversion, wherein the improvement comprises a high frequency component attenuation means which attenuates high frequency components of the electric charges bearing thereon high frequency components of the image information not lower than a Nyquist frequency, which is defined by the pitches of the two-dimensional image detecting elements, so that aliasing noise due to the high frequency components of the image information not lower than the Nyquist frequency becomes not stronger than 30% of intrinsic noise power at a frequency equal to a half of the Nyquist frequency, further including a transparent conductor disposed over the conversion means, wherein the high frequency component attenuation means is disposed in physical contact over the transparent conductor.

2. A radiation image detecting system comprising:

a conversion means for converting radiation bearing thereon image information into electric changes;

a two-dimensional detecting means for detecting the electric charges obtained by the conversion means; and a high frequency component attenuation means for selectively attenuating high frequency components of the electric charges bearing thereon high frequency components of the image information not lower than a Nyquist frequency, which is defined by pitches between detecting elements in the two-dimensional detecting means, so that aliasing noise due to the high frequency components of the image information not lower than the Nyquist frequency becomes not stronger than 30% of intrinsic noise power at a frequency equal to a half of the Nyquist frequency, further including a transparent conductor disposed over the conversion means, wherein the high frequency component attenuation means is disposed in physical contact over the transparent conductor.

3. The radiation image detecting system, comprising:

a radiation-to-electric charge converter;

two-dimensional charge detectors detecting the electric charges obtained by the converter; and a high frequency component attenuator, said attenuator attenuating high frequency components of the electric charges bearing thereon high frequency components of image information not lower than a Nyquist frequency, which is defined by the pitches of the two-dimensional charge detectors, so that aliasing noise due to the high frequency components of the image information not lower than the Nyquist frequency becomes not stronger than 30% of intrinsic noise power at a frequency equal to a half of the Nyquist frequency, further including a transparent conductor disposed over the converter, wherein the high frequency component attenuator is disposed in physical contact over the transparent conductor.

4. A radiation image detecting system, comprising:

a conversion means for converting radiation bearing thereon image information into electric charges;

a two-dimensional detecting means for detecting the electric charges obtained by the conversion means; and a high frequency component attenuation means for selectively attenuating high frequency components of the electric charges bearing thereon high frequency components of the image information not lower than a Nyquist frequency, which is defined by pitches between detectors in the two-dimensional detecting means, so that aliasing noise due to the high frequency components of the image information not lower than the Nyquist frequency becomes not stronger than 30% of intrinsic noise power at a frequency equal to a half of the Nyquist frequency, wherein the high frequency attenuator means attenuates the high frequency component using variation of at least one of an electric field, and a magnetic field applied to the converting means.

* * * * *